United States Patent
Saito et al.

(10) Patent No.: US 7,166,929 B2
(45) Date of Patent: Jan. 23, 2007

(54) DIAGNOSTIC APPARATUS AND DIAGNOSTIC METHOD FOR FUEL CELL

(75) Inventors: Norihiko Saito, Susono (JP); Masaaki Kondo, Owariasahi (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 444 days.

(21) Appl. No.: 10/715,457

(22) Filed: Nov. 19, 2003

(65) Prior Publication Data

US 2004/0106025 A1    Jun. 3, 2004

(30) Foreign Application Priority Data

Nov. 27, 2002  (JP)  ............... 2002-344415

(51) Int. Cl.
  *B60L 1/00*   (2006.01)
  *B60L 3/00*   (2006.01)
  *H02G 3/00*   (2006.01)

(52) U.S. Cl. .................................... 307/10.1
(58) Field of Classification Search ................ 307/10.1
    See application file for complete search history.

(56) References Cited

U.S. PATENT DOCUMENTS 6,519,539 B1 *  2/2003  Freeman et al. ............... 702/65
6,815,100 B2 *  11/2004  Aoyagi et al. ................. 429/13

FOREIGN PATENT DOCUMENTS

| EP | 0 486 654 B1 | 12/1996 |
| JP | A 9-245826 | 9/1997 |
| JP | A 2002-216822 | 8/2002 |

OTHER PUBLICATIONS

Copy of German Office Action No. 103 53 848.8, issued Sep. 23, 2005.
Copy of English Translation of German Office Action No. 103 53 848.8, issued Sep. 23, 2005.

* cited by examiner

*Primary Examiner*—Stephen W. Jackson
*Assistant Examiner*—Carlos Amaya
(74) *Attorney, Agent, or Firm*—Kenyon & Kenyon LLP

(57) ABSTRACT

According to one aspect of the invention, a diagnostic apparatus for a fuel cell installed in a moving object as a power source is characterized by comprising an operation control portion that is connected to a control system installed in the moving object to perform operation control of the fuel cell and that performs operation control of the fuel cell by issuing an operational instruction to the control system, a diagnostic portion that diagnoses a state of the fuel cell on the basis of operation of the fuel cell controlled by the operation control portion, and a power adjustment portion that adjusts power obtained from the fuel cell operated by the operation control portion during a diagnosis made by the diagnostic portion.

16 Claims, 4 Drawing Sheets

DIAGNOSTIC APPARATUS AND DIAGNOSTIC METHOD FOR FUEL CELL

INCORPORATION BY REFERENCE

The disclosure of Japanese Patent Application No. 2002-344415 filed on Nov. 27, 2002, including the specification, drawings, and abstract is incorporated herein by reference in its entirety.

BACKGROUND OF THE INVENTION

1. Field of the Invention

The invention relates to a diagnostic apparatus and a diagnostic method for a fuel cell and, more particularly, to a diagnostic apparatus and a diagnostic method for diagnosing a state of a fuel cell installed in a moving object as a power source.

2. Description of the Related Art

Heretofore, there has been proposed a fuel cell system of this type which makes a determination on an abnormal operational state such as excessiveness or scarceness of water contained in a fuel cell stack and which performs control to normalize the abnormal operational state (e.g., Japanese Patent Application Laid-Open No. 9-245826). In this system, time-dependent change patterns of a voltage in a cell or cell block constituting the fuel cell stack are measured and stored in advance as to various operational conditions, and a determination on an operational state of the fuel cell stack is made by comparing an actual time-dependent pattern with the stored patterns.

However, if the fuel cell system thus constructed is installed in a vehicle, an operational abnormality of the fuel cell stack during a running state of the vehicle cannot be reproduced easily when the vehicle is stopped. If an operational abnormality occurs in the fuel cell stack while the vehicle is running, a state of the operational abnormality needs to be reproduced so as to have the cause thereof fathomed in a repair shop or the like. However, since operation of the fuel cell stack during stoppage of the vehicle makes it impossible to consume power obtained from the fuel cell stack, the state of the operational abnormality cannot be reproduced. A similar problem crops up during inspection or maintenance for obviating abnormalities or malfunctions as well.

SUMMARY OF THE INVENTION

A diagnostic apparatus and a diagnostic method in accordance with the invention aim at diagnosing a state of a fuel cell installed in a moving object during stoppage thereof while holding the fuel cell in operation. The diagnostic apparatus and the diagnostic method in accordance with the invention also aim at diagnosing a state of the fuel cell while holding the fuel cell in operation without operating a fuel gas supply system installed in the moving object. In addition, the diagnostic apparatus and the diagnostic method in accordance with the invention also aim at diagnosing a state of the fuel cell while holding the fuel cell in operation without operating a cooling system installed in the moving object.

In the diagnostic apparatus and the diagnostic method in accordance with the invention, the following measures are taken to achieve at least one of the objects stated above.

According to one aspect of the invention, there is provided a diagnostic apparatus for a fuel cell installed in a moving object as a power source. As the gist of this aspect of the invention, the diagnostic apparatus comprises an operation control portion that is connected to a control system installed in the moving object to perform operation control of the fuel cell and that performs operation control of the fuel cell by issuing an operational instruction to the control system, a diagnostic portion that diagnoses a state of the fuel cell on the basis of operation of the fuel cell controlled by the operation control portion, and a power adjustment portion that adjusts power obtained from the fuel cell operated by the operation control portion during a diagnosis made by the diagnostic portion.

In the diagnostic apparatus of the aforementioned aspect, the operation control portion is connected to the control system that is installed in the moving object to perform operation control of the fuel cell. The operation control portion issues an operational instruction to the control system, whereby operation of the fuel cell is controlled. The power adjustment portion adjusts power obtained from the fuel cell thus operated, and a state of the fuel cell is diagnosed on the basis of operation of the fuel cell. Accordingly, the state of the fuel cell can be diagnosed while the fuel cell is held in operation with the moving object being stopped.

In the diagnostic apparatus of the aforementioned aspect, information on an operational state of the fuel cell may be input to the operation control portion via the control system. In this construction, the fuel cell is allowed to assume a desired operational state. In the diagnostic apparatus of this aspect, the diagnostic portion may diagnose a state of the fuel cell on the basis of information on the operational state of the fuel cell which has been input to the operation control portion via the control system. In this construction, a diagnosis of the fuel cell can be made using information input to the control system of the moving object. Therefore, the fuel cell can be diagnosed more accurately.

Furthermore, in the diagnostic apparatus of the aforementioned aspect, the operation control portion may control adjustment of power by the power adjustment portion. In this construction, power obtained from the fuel cell can also be controlled by the operation control portion.

Moreover, in the diagnostic apparatus of the aforementioned aspect, the power adjustment portion may be connected to an output terminal of the fuel cell and adjust power by absorbing or consuming power obtained from the fuel cell.

In the diagnostic apparatus of the aforementioned aspect, the power adjustment portion may be provided with an accumulator portion that can be changed with and discharged of electricity, and adjust power by charging the accumulator portion with power obtained from the fuel cell.

In the diagnostic apparatus of the aforementioned aspect, the operation control portion may adjust power by charging an accumulator portion installed in the moving object with power obtained from the fuel cell. In this construction, power obtained from the fuel cell can be utilized after a diagnosis has been carried out. In the diagnostic apparatus of this aspect, the accumulator portion may be provided in a charging system installed in the moving object. In this construction, there is no need to provide a power adjustment portion as a separate component.

In the diagnostic apparatus of the aforementioned aspect, the power adjustment portion may adjust power by consuming power obtained from the fuel cell by a power-consuming unit installed in the moving object. In this construction, power obtained from the fuel cell can be consumed by the power-consuming unit installed in the moving object. In particular, if a unit for mobile purposes is employed as the power-consuming unit so as to consume power, a state of the fuel cell during movement of the moving object can be reproduced with high precision. In the diagnostic apparatus of this aspect, the power adjustment portion may include a unit control system that is installed in the moving object to control driving of the power-consuming unit consuming power obtained from the fuel cell. In this construction, there is no need to provide a power adjustment portion as a separate component.

Furthermore, the diagnostic apparatus of the aforementioned aspect may comprise a fuel gas supply portion that supplies the fuel cell with a fuel gas as a substitute for a fuel gas supply system that is installed in the moving object to supply the fuel cell with a fuel gas serving for power generation by the fuel cell. In this construction, a state of the fuel cell can be diagnosed while holding the fuel cell in operation without operating the fuel gas supply system installed in the moving object.

Furthermore, the diagnostic apparatus of the aforementioned aspect may comprise a cooling portion that cools the fuel cell as a substitute for a cooling system that is installed in the moving object to cool the fuel cell. In this construction, a state of the fuel cell can be diagnosed while holding the fuel cell in operation without operating the cooling system installed in the moving object.

According to another aspect of the invention, there is provided a diagnostic method for a fuel cell installed in a moving object as a power source. This diagnostic method comprises the steps of performing operation control of the fuel cell by issuing a predetermined operational instruction to a control system that is installed in the moving object to perform operation control of the fuel cell, adjusting power obtained from the fuel cell operated by the predetermined operational instruction, and diagnosing a state of the fuel cell on the basis of operation of the fuel cell resulting from the operational instruction.

In the diagnostic method of the aforementioned aspect, the fuel cell is operated by issuing the predetermined operational instruction to the control system that is installed in the moving object to perform operation control of the fuel cell. Power obtained from the fuel cell thus operated is adjusted, and a state of the fuel cell is diagnosed on the basis of operation of the fuel cell. Therefore, the state of the fuel cell can be diagnosed while the fuel cell is held in operation with the moving object being stopped.

In the diagnostic method of the aforementioned aspect, a fuel gas serving for power generation by the fuel cell is supplied to the fuel cell from the outside of the moving object for the diagnosis. In this construction, a state of the fuel cell can be diagnosed while holding the fuel cell in operation without operating the fuel gas supply system installed in the moving object.

In the diagnostic method of the aforementioned aspect, a coolant is supplied to the fuel cell from the outside of the moving object so as to cool the fuel cell for the diagnosis. In this construction, a state of the fuel cell can be diagnosed while holding the fuel cell in operation without operating the cooling system installed in the moving object.

DETAILED DESCRIPTION OF PREFERRED EMBODIMENT

Figure 1:
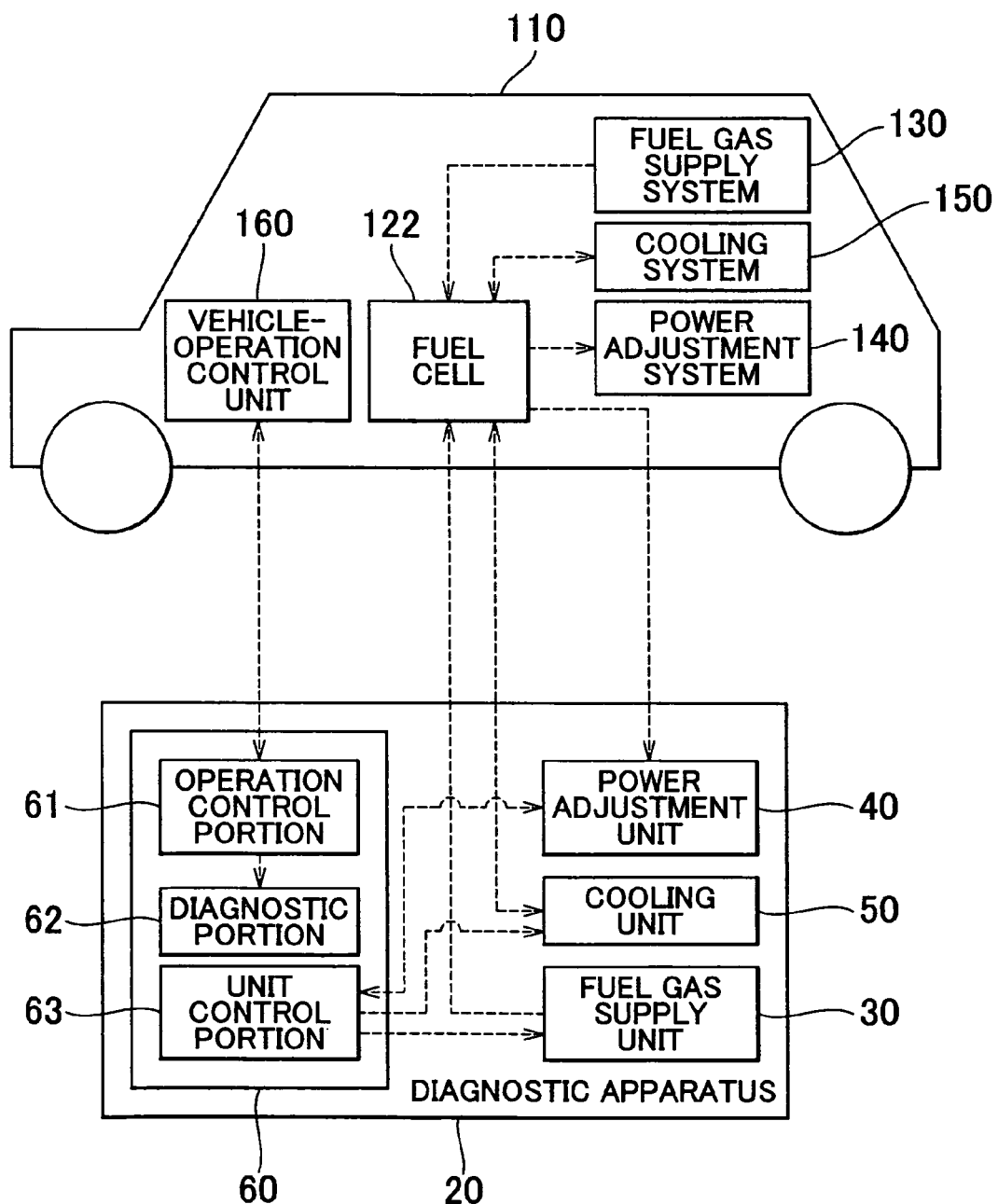
FIG. 1 is a conceptual view exemplifying a constructional concept in diagnosing a state of a fuel cell 122 installed in a vehicle 110 by means of a fuel-cell diagnostic apparatus 20 in accordance with one embodiment of the invention.
Figure 2:
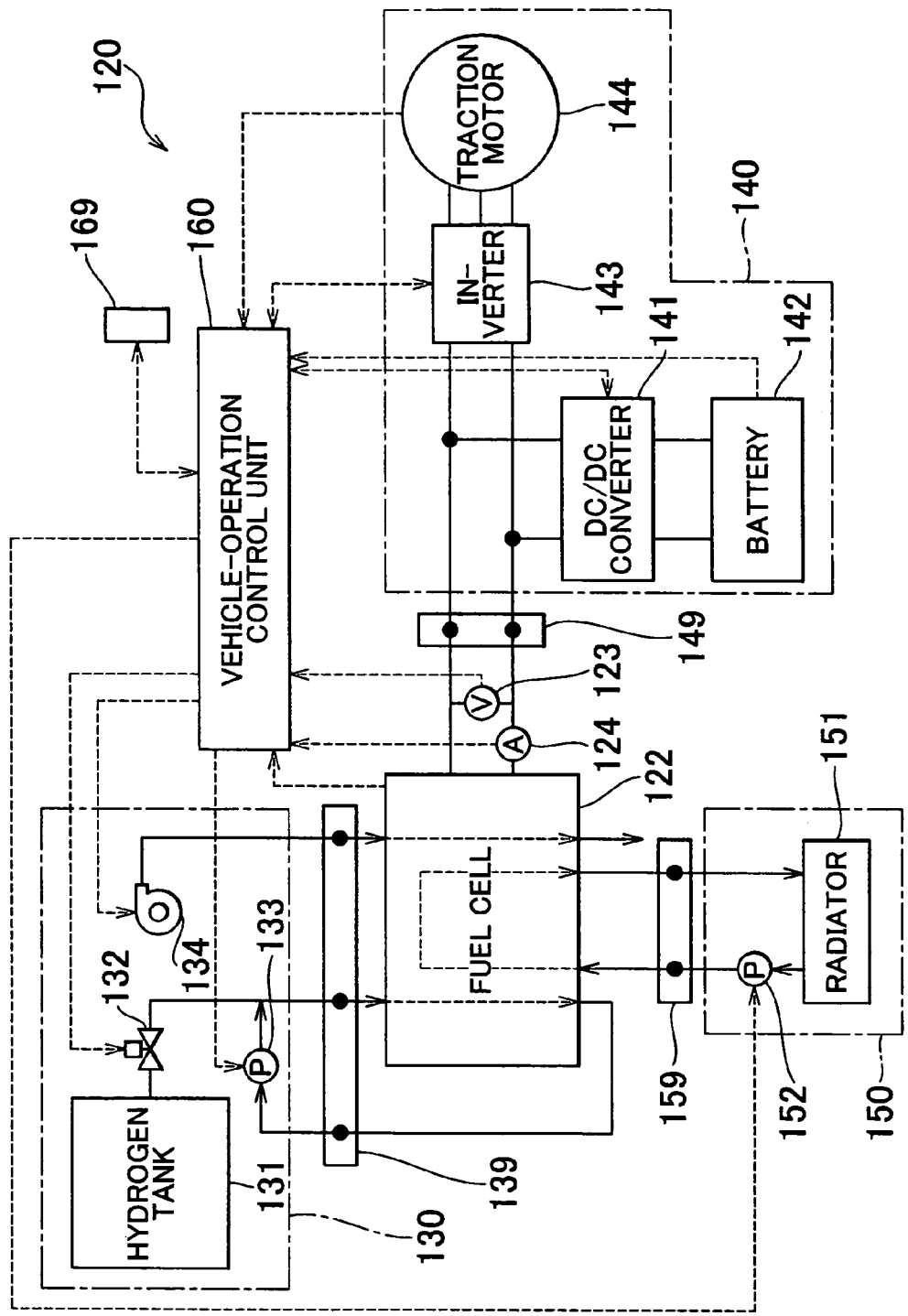
FIG. 2 is a block diagram showing the overall construction of a fuel cell system 120 installed in the vehicle.
Figure 3:
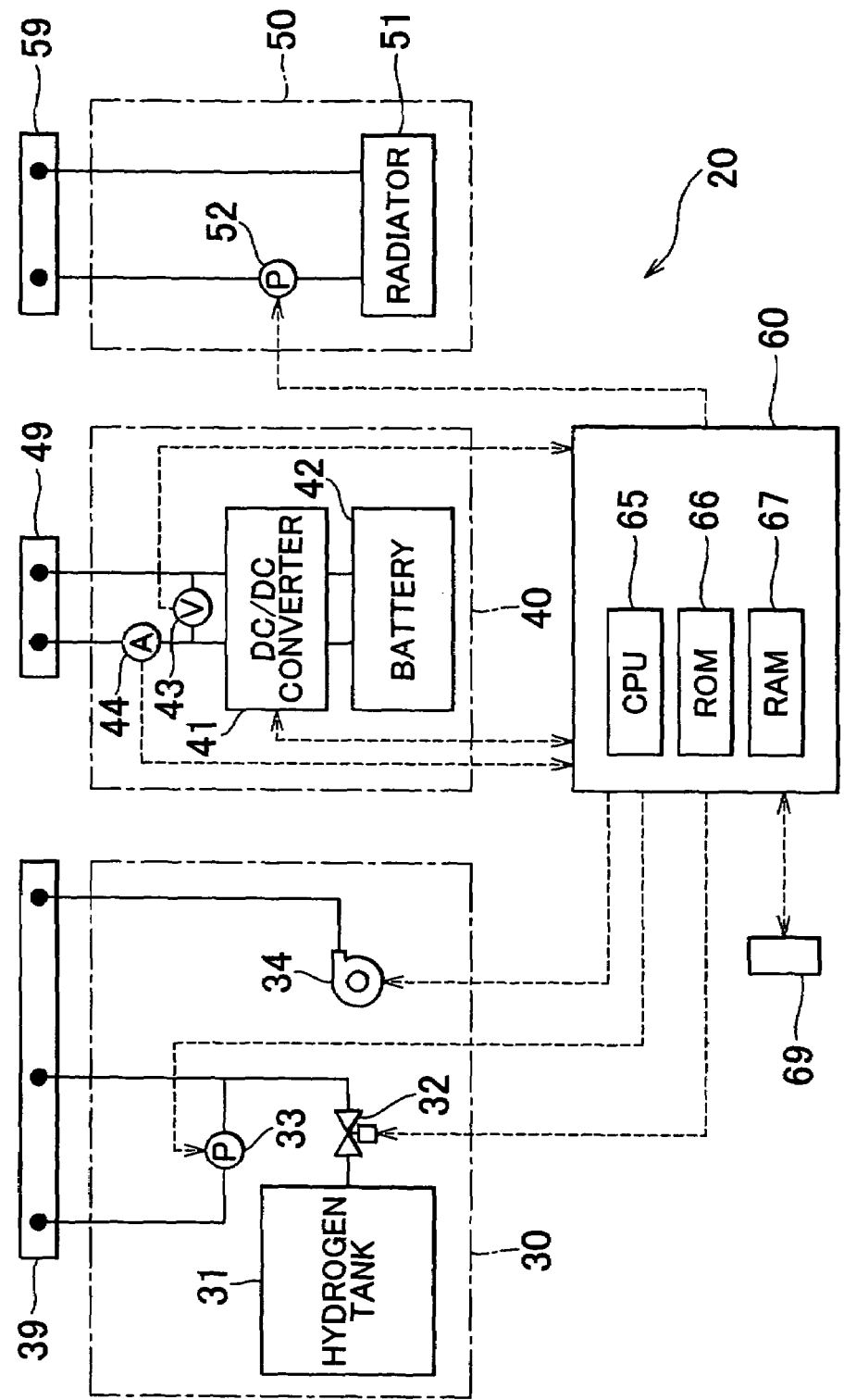
FIG. 3 is a block diagram showing the overall construction of the diagnostic apparatus 20 of the embodiment.

Next, a mode of implementing the invention will be described based on the embodiment thereof. FIG. 1 is a conceptual view exemplifying a constructional concept in diagnosing a state of the fuel cell 122 installed in the vehicle 110 by means of the fuel-cell diagnostic apparatus 20 in accordance with one embodiment of the invention. FIG. 2 is a block diagram showing the overall construction of the fuel cell system 120 installed in the vehicle. FIG. 3 is a block diagram showing the overall construction of the diagnostic apparatus 20 of the embodiment. For convenience of explanation, the construction of the fuel cell system 120 installed in the vehicle 110 will be described first, and then the construction of the fuel-cell diagnostic apparatus 20 of the embodiment will be described in detail.

As shown in FIG. 2, the fuel cell system 120 includes a fuel gas supply system 130 that supplies a fuel cell 122 with hydrogen and air as fuel, a power adjustment system 140 that adjusts power generated by the fuel cell 122 with a view to using the power to drive a vehicle or accumulating the power, a cooling system 150 that cools the fuel cell 122, and a vehicle-operation control unit 160 that controls operation of the fuel cell 122 while controlling a running state of the vehicle.

For example, the fuel cell 122 is constructed as a proton-exchange membrane fuel cell made of a plurality of laminated cells, each of which includes a polymer membrane exhibiting good proton conductivity in a wet state is employed as an electrolytic membrane. Power is generated through an electrochemical reaction that is caused by supplying hydrogen and oxygen respectively to a fuel-electrode-side flow passage and an air-electrode-side flow passage that are formed on opposed sides of the electrolytic membrane.

The fuel gas supply system 130 includes a hydrogen tank 131 that stores high-pressure hydrogen and that is connected to the fuel-electrode-side flow passage of the fuel cell 122 via an adjusting valve 132, a hydrogen pump 133 that causes hydrogen supplied from the hydrogen tank 131 to circulate through a circulation passage including the fuel-electrode-side flow passage of the fuel cell 122, and an air supply pump 134 that supplies the air-electrode-side flow passage of the fuel cell 122 with air as an oxidative gas containing oxygen. A fuel gas supply unit fitting portion 139 for fitting a fuel gas supply unit 30 of the fuel-cell diagnostic apparatus 20 of the embodiment is provided in the fuel gas supply system 130 at a position to be connected to the fuel cell 122.

The power adjustment system 140 includes a battery 142 connected to an output terminal of the fuel cell 122 via a DC/DC converter 141, and a traction motor 144 connected to the output terminal of the fuel cell 122 via an inverter 143. The power adjustment system 140 is designed such that the traction motor 144 can consume power and that the battery 142 can be charged with electricity and electricity can be discharged from the battery 142. A power adjustment unit fitting portion 149 for fitting a power adjustment unit 40 of the fuel-cell diagnostic apparatus 20 of the embodiment is provided in the power adjustment system 140 at a position to be connected to the fuel cell 122.

The cooling system 150 is constructed as a circulation passage including a flow passage of coolant for the fuel cell 122. The cooling system 150 includes a radiator 151 that air-cools coolant, and a coolant pump 152 that causes coolant to circulate. By causing coolant cooled by the radiator 151 to circulate through the circulation passage, the cooling system 150 cools the fuel cell 122. A cooling unit fitting portion 159 for fitting a cooling unit 50 of the fuel-cell diagnostic apparatus 20 of the embodiment is provided in the cooling system 150 at a position to be connected to the fuel cell 122.

The vehicle-operation control unit 160 is constructed as a microcomputer mainly composed of a CPU (not shown), and includes an input port, an output port, and a communication port. Signals indicating an cell voltage detected by a voltage sensor for detecting a voltage between cells constituting the fuel cell 122, a fuel cell temperature detected by a temperature sensor (not shown) attached to the fuel cell 122, an interterminal voltage detected by a voltage sensor 123 attached to a power line in the vicinity of an output terminal of the fuel cell 122, an output current detected by a current sensor 124 attached to the power line in the vicinity of the output terminal of the fuel cell 122, a voltage detected by a voltage sensor (not shown) attached to the DC/DC converter 141, a current detected by a current sensor (not shown) attached to the DC/DC converter 141, a charge/discharge voltage detected by a voltage sensor (not shown) attached to a power line in the vicinity of an output terminal of the battery 142, a charge/discharge current detected by a current sensor (not shown) attached to the power line in the vicinity of the output terminal of the battery 142, a phase current of the traction motor 144 detected by a current sensor (not shown) attached to a power line extending from an inverter 143 to the traction motor 144, a position of a rotor detected by a rotational position sensor (not shown) attached to the traction motor 144, and the like are input to the vehicle-operation control unit 160 via the input port. A drive signal for the adjusting valve 132, a drive signal for the hydrogen pump 133, a drive signal for the air supply pump 134, a switching control signal for the DC/DC converter 141, a switching control signal for the inverter 143, a drive signal for the coolant pump 152, and the like are output from the vehicle-operation control unit 160 via the output port. A connector 169 for connection to a control unit 60 of the fuel-cell diagnostic apparatus 20 of the embodiment is connected to the communication port of the vehicle-operation control unit 160.

Next, the construction of the fuel-cell diagnostic apparatus 20 of the embodiment will be described. As shown in FIGS. 1 and 3, the fuel-cell diagnostic apparatus 20 of the embodiment includes the fuel gas supply unit 30 that supplies the fuel cell 122 with hydrogen and air as fuel, the power adjustment unit 40 that adjusts power generated by the fuel cell 122, and the cooling unit 50 that cools the fuel cell 122, instead of the fuel gas supply system 130 of the fuel cell system 120, the power adjustment system 140 of the fuel cell system 120, and the cooling system 150 of the fuel cell system 120, respectively. The fuel-cell diagnostic apparatus 20 also includes the control unit 60 that is connected to the vehicle-operation control unit 160 of the fuel cell system 120 so as to exchange communications therewith and that controls the entire apparatus.

As shown in FIG. 3, the fuel gas supply unit 30 includes a hydrogen tank 31 whose outlet and inlet are provided with adjusting valves 32, a hydrogen pump 33 for causing hydrogen to circulate, and an air supply pump 34 for supplying air. When fitted to the fuel gas supply unit fitting portion 139 of the fuel cell system 120 by means of a fuel gas supply system fitting portion 39, the fuel gas supply unit 30 functions substantially in the same manner as the fuel gas supply system 130 of the fuel cell system 120.

The power adjustment unit 40 includes a DC/DC converter 41 capable of raising and lowering a direct-current voltage, and a chargeable/dischargeable battery 42 that is connected to the DC/DC converter 41. When connected to the power adjustment unit fitting portion 149 of the fuel cell system 120 by means of a power adjustment system fitting portion 49, the power adjustment unit 40 can freely charge the battery 42 with power generated by the fuel cell 122. A voltage sensor 43 for detecting a voltage applied to the fuel cell 122 and a current sensor 44 for detecting a current flowing through the fuel cell 122 are attached to the DC/DC converter 41 on the side of the power adjustment system fitting portion 49.

The cooling unit 50 includes a radiator 51 that cools coolant by means of outside air, and a coolant pump 52 for causing coolant to circulate. By being fitted on the cooling unit fitting portion 159 by means of a cooling system fitting portion 59, the cooling unit 50 functions substantially in the same manner as the cooling system 150 of the fuel cell system 120.

As shown in FIG. 1, the control unit 60 is functionally composed of an operation control portion 61 that controls operation of the fuel cell 122 by means of the vehicle-operation control unit 160, a diagnostic portion that diagnoses a state of the fuel cell 122 on the basis of a state of the fuel cell 122 that is in operation, and a unit control portion 63 that controls the fuel gas supply unit 30, the power adjustment unit 40, and the cooling unit 50. As shown in FIG. 3, the control unit 60 is hardwarewise constructed as a microcomputer mainly composed of a CPU 65, a ROM 66, and a RAM 67. The control unit 60 receives, via an input port (not shown), signals indicating a voltage detected by the voltage sensor 43, a current detected by the current sensor 44, and the like. The control unit 60 outputs, via an output port (not shown), a drive signal for the adjusting valve 32, a drive signal for the hydrogen pump 33, a drive signal for the air supply pump 34, a switching control signal for the DC/DC converter 41, a drive signal for the coolant pump 52, and the like. A connector 69 that can be connected to the connector 169 connected to the communication port of the vehicle-operation control unit 160 of the fuel cell system 120 is attached to a communication port (not shown) of the control unit 60.

Next, it will be described how a diagnosis of a state of the fuel cell 122 installed in the vehicle 110 is made using the fuel-cell diagnostic apparatus 20 of the embodiment constructed as described above. First to fourth diagnostic patterns are set for the fuel-cell diagnostic apparatus 20 of the embodiment. According to the first diagnostic pattern, a diagnosis is made with the control unit 60 and the vehicle-operation control unit 160 being connected via the connector 69 and the connector 169 and with the power adjustment system fitting portion 49 being fitted to the power adjustment unit fitting portion 149 so that the power adjustment unit 40 is connected to the fuel cell system 120. According to the second diagnostic pattern, a diagnosis is made with the fuel gas supply system fitting portion 39 being attached to the fuel gas supply unit fitting portion 139 so that the fuel gas supply unit 30 is connected to the fuel cell system 120, in addition to the configuration of the first diagnostic pattern. According to the third diagnostic pattern, a diagnosis is made with the cooling system fitting portion 59 being attached to the cooling unit fitting portion 159 so that the cooling unit 50 is connected to the fuel cell system 120, in addition to the configuration of the first diagnostic pattern. According to the fourth diagnostic pattern, a diagnosis is made with the fuel gas supply unit 30, the power adjustment unit 40, and the cooling unit 50 being all connected to the fuel cell system 120. That is, the first diagnostic pattern is used when the fuel gas supply system 130 and the cooling system 150 as well as a state of the fuel cell 122 are diagnosed while the fuel gas supply system 130 and the cooling system 150 are held in operation. The second diagnostic pattern is used when there is an abnormality occurring in the fuel gas supply system 130 or when a diagnosis is made without taking the influence of the fuel gas supply system 130 into account. The third diagnostic pattern is used when there is an abnormality occurring in the cooling system 150 or when a diagnosis is made without taking the influence of the cooling system 150 into account. The fourth diagnostic pattern is used when there are abnormalities occurring in the fuel gas supply system 130 and the cooling system 150 or when a diagnosis is made only as to the fuel cell 122 without taking the influences of the fuel gas supply system 130 and the cooling system 150 into account.

In the first diagnostic pattern, an operational instruction is output through communication to the vehicle-operation control unit 160 from the operation control portion 61 of the control unit 60 such that the fuel gas supply system 130 and the power adjustment system 140 operate in a predetermined manner, and a switching control signal is output to the DC/DC converter 41 of the power adjustment unit 40 from the unit control portion 63 such that the current flowing through the fuel cell 122 assumes a predetermined pattern. In accordance with changes in current flowing through the fuel cell 122, state information on the fuel cell 122 (cell voltage, fuel cell temperature, and the like) is input through communication to the operation control portion 61 from the vehicle-operation control unit 160. A diagnostic portion 62 diagnoses a state of the fuel cell 122 on the basis of the state information on the fuel cell 122 which has been input to the operation control portion 61. States of the fuel cell 122 such as flooding on the anode side, flooding on the cathode side, the drying up of the electrolytic membrane, leakage (cross leakage) of hydrogen and oxygen from the electrolytic membrane, shortcircuiting, contamination resulting from metal ions, and the like can be diagnosed, for example, by changing the amount of water supplied to the fuel cell 122, the amount of air supplied to the fuel cell 122, the pressure applied to the fuel cell 122, or the current flowing through the fuel cell 122.

In the second, third or fourth diagnostic pattern, even when at least one of the fuel gas supply system 130 and the cooling system 150 is out of order, it is possible to diagnose a state of the fuel cell 122 by operating the fuel gas supply unit 30 or the cooling unit 50 as in the case of the first diagnostic pattern.

The fuel-cell diagnostic apparatus 20 of the embodiment described hitherto can diagnose a state of the fuel cell 122 while the fuel cell 122 is held in operation during stoppage of the vehicle 110, without removing the fuel cell 122 installed in the vehicle 110 therefrom. Moreover, even if there is an abnormality occurring in the fuel gas supply system 130 or the cooling system 150 of the fuel cell system 120, the fuel-cell diagnostic apparatus 20 can diagnose a state of the fuel cell 122 while the fuel cell 122 is held in operation with the fuel gas supply unit 30 or the cooling unit 50 being connected thereto.

In the fuel-cell diagnostic apparatus 20 of the embodiment, the DC/DC converter 41 and the battery 42 are employed as the power adjustment unit 40. However, as long as power generated by the fuel cell 122 can be adjusted, a power-consuming load can be employed instead of the battery 42.

Figure 4:
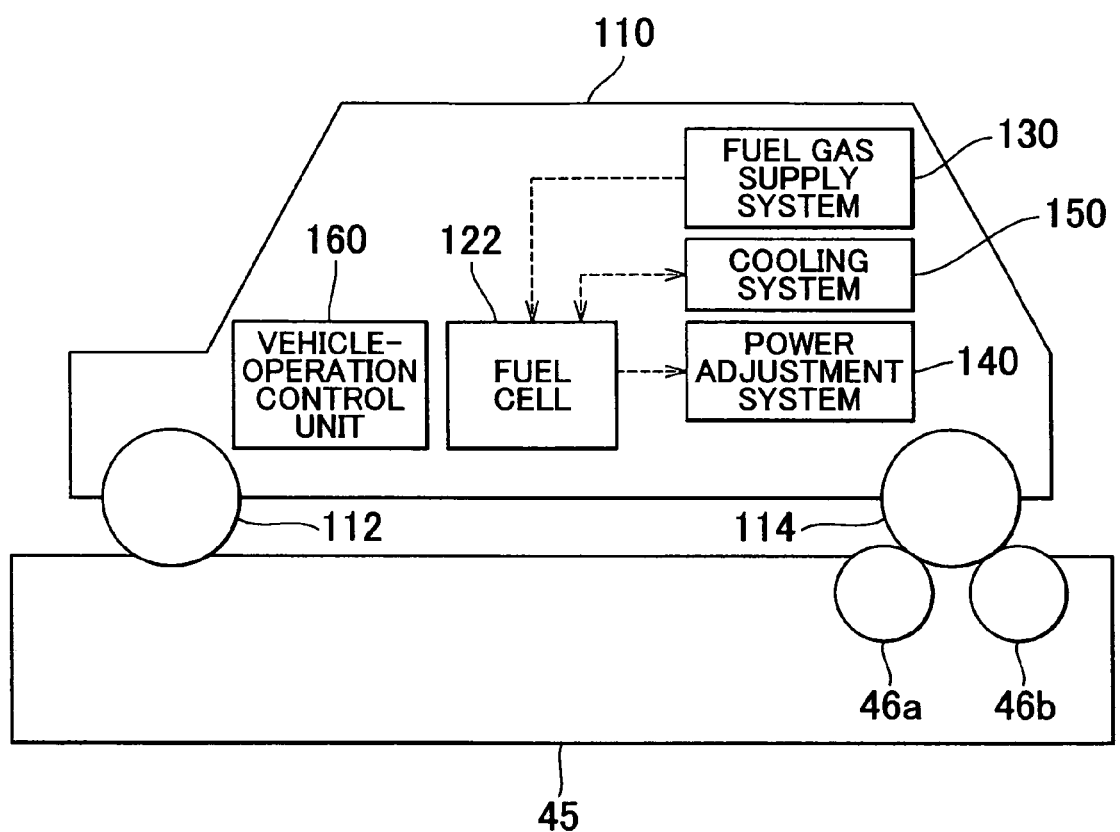
FIG. 4 is an explanatory view showing a drive unit 45 as an example.

In the fuel-cell diagnostic apparatus 20 of the embodiment, power generated by the fuel cell 122 is adjusted by the power adjustment unit 40. However, it is also appropriate that power generated by the fuel cell 122 be adjusted using the DC/DC converter 141 and the battery 142 of the power adjustment system 140 of the fuel cell system 120. In this case, it is appropriate that power generated by the fuel cell 122 be adjusted by outputting a switching control signal to the DC/DC converter 141 via the vehicle-operation control unit 160. It is also appropriate that power generated by the fuel cell 122 be consumed by the traction motor 144 of the power adjustment system 140 of the fuel cell system 120. In this case, as exemplified in FIG. 4, it is appropriate to employ the drive unit 45 or the like, which is capable of applying substantially the same load as in a running state of the vehicle 110 to driving wheels 114 thereof by means of load-applying rollers 46a and 46b. Thus, the fuel cell 122 can be diagnosed with the fuel cell system 120 installed in the vehicle 110 assuming substantially the same state as the state while the vehicle 110 is running.

In the fuel-cell diagnostic apparatus 20 of the embodiment, the fuel cell 122 is diagnosed according to one of the first to fourth diagnostic patterns. It is also appropriate, however, that a diagnosis of the fuel cell 122 based on a certain one of the second to fourth diagnostic patterns be made infeasible. Namely, the fuel-cell diagnostic apparatus 20 may dispense with at least one of the fuel gas supply unit 30 and the cooling unit 50.

In the fuel-cell diagnostic apparatus 20 of the embodiment, the fuel cell 122 is diagnosed while being installed in the vehicle 110. Obviously, however, the fuel cell 122 can also be diagnosed after having been unloaded from the vehicle 110 for the purpose of repair, inspection or the like.

The fuel-cell diagnostic apparatus 20 of the embodiment is designed to diagnose the fuel cell 122 of the fuel cell system 120 installed in the vehicle 110. However, the fuel-cell diagnostic apparatus 20 may also be designed to diagnose a fuel cell of a fuel cell system installed in a moving object other than the vehicle 110, for example, an airplane, a ship or the like.

Although the mode of implementing the invention has been described hitherto based on the embodiment thereof, it is evident that the invention is not limited to the embodiment described above and that the invention can be implemented in various modes without departing from the spirit thereof.

What is claimed is:

1. A diagnostic apparatus for a fuel cell, the fuel cell installed in a moving object as a power source to move the moving object, the moving object including a moving object control system to perform operation control of the fuel cell, the diagnostic apparatus separate from the moving object, and the diagnostic apparatus comprising:

an operation control portion that is connectable to the moving object control system and that performs operation control of the fuel cell by issuing an operational instruction to the moving object control system;

a diagnostic portion that diagnoses a state of the fuel cell on the basis of operation of the fuel cell controlled by the operation control portion; and a power adjustment portion that adjusts power obtained from the fuel cell operated by the operation control portion during a diagnosis made by the diagnostic portion.

2. The diagnostic apparatus according to claim 1, wherein information on an operational state of the fuel cell is input to the operation control portion via the moving object control system.

3. The diagnostic apparatus according to claim 2, wherein the diagnostic portion diagnoses a state of the fuel cell on the basis of information on the operational state of the fuel cell which has been input to the operation control portion via the moving object control system.

4. The diagnostic apparatus according to claim 1, wherein the operation control portion controls adjustment of power by the power adjustment portion.

5. The diagnostic apparatus according to claim 1, wherein the power adjustment portion is connected to an output terminal of the fuel cell and adjusts power by absorbing or consuming power obtained from the fuel cell.

6. The diagnostic apparatus according to claim 1, wherein the power adjustment portion is provided with an accumulator portion that can be charged with and discharged of electricity, and adjusts power by charging the accumulator portion with power obtained from the fuel cell.

7. The diagnostic apparatus according to claim 1, wherein the diagnostic apparatus is separate from the moving object.

8. The diagnostic apparatus according to claim 1, wherein the operation control portion adjusts power by charging an accumulator portion installed in the moving object with power obtained from the fuel cell.

9. The diagnostic apparatus according to claim 8, wherein the power adjustment portion is a charging system that is installed in the moving object and that can charge the accumulator portion with power obtained from the fuel cell.

10. The diagnostic apparatus according to claim 1, wherein
the power adjustment portion adjusts power by consuming power obtained from the fuel cell by a power-consuming unit installed in the moving object.

11. The diagnostic apparatus according to claim 10, wherein
the power adjustment portion includes a unit control system that is installed in the moving object to control driving of the power-consuming unit consuming power obtained from the fuel cell.

12. The diagnostic apparatus according to claim 1, further comprising:
a fuel gas supply portion that supplies the fuel cell with a fuel gas as a substitute for a fuel gas supply system installed in the moving object to supply the fuel cell with a fuel gas serving for power generation by the fuel cell.

13. The diagnostic apparatus according to claim 1, further comprising:
a cooling portion that cools the fuel cell as a substitute for a cooling system installed in the moving object to cool the fuel cell.

14. A diagnostic method for a fuel cell, the fuel cell installed in a moving object as a power source to move the moving object, the moving object including a moving object control system to perform operation control of the fuel cell, the method comprising the steps of:
performing operation control of the fuel cell by issuing a predetermined operational instruction to the moving object control system;
adjusting power obtained from the fuel cell operated by the predetermined operational instruction; and
diagnosing a state of the fuel cell on the basis of operation of the fuel cell resulting from the operational instruction.

15. The diagnostic method according to claim 14, wherein
a fuel gas serving for power generation by the fuel cell is supplied to the fuel cell from the outside of the moving object for the diagnosis.

16. The diagnostic method according to claim 14, wherein
a coolant is supplied to the fuel cell from the outside of the moving object so as to cool the fuel cell for the diagnosis.

* * * * *